United States Patent [19]

Beneking

[11] 3,803,461

[45] Apr. 9, 1974

[54] SEMICONDUCTOR ARRANGEMENTS

[75] Inventor: Heinz Beneking, Aachen, Germany

[73] Assignee: Licentia Patent-Verwaltungs-G.m.b.H., Frankfurt/Main, Germany

[22] Filed: Nov. 27, 1972

[21] Appl. No.: 309,663

[30] Foreign Application Priority Data

Dec. 1, 1971 Germany ........................... 2159592

[52] U.S. Cl. ...... 317/235 R, 317/235 B, 317/235 G

[51] Int. Cl. ........................................... H01l 11/00

[58] Field of Search ...................................... 317/235

[56] References Cited

UNITED STATES PATENTS 3,355,598 11/1967 Tuska ............................... 307/88.5

3,602,781 8/1971 Hart.................................. 317/235

*Primary Examiner*—Rudolph V. Rolinec
*Assistant Examiner*—E. Wojciechowicz
*Attorney, Agent, or Firm*—Spencer & Kaye

[57] ABSTRACT

A semiconductor arrangement comprises a field effect transistor tetrode and a field effect transistor triode in a single semiconductor body, one electrode of the triode entering between the source and the drain electrodes of the tetrode to form one of the two control electrodes thereof.

10 Claims, 9 Drawing Figures

SEMICONDUCTOR ARRANGEMENTS

BACKGROUND OF THE INVENTION

The invention relates to a semiconductor arrangement with a field effect transistor tetrode and a further field effect transistor.

Field effect transistors with two control electrodes which are insulated from the semiconductor surface and which are arranged between a source and a drain electrode are known. Such transistors, which are many time known also as MIS- FET-tetrodes, have a very small reactive capacitance and a high internal resistance and are required above all for VHF and UHF applications.

A tetrode and a further field effect transistor are required for certain circuits.

SUMMARY OF THE INVENTION

It is an object of the invention to provide a particularly advantageous arrangement of these components.

According to the invention, there is provided a semiconductor arrangement comprising a semiconductor body, a field effect transistor tetrode in said semiconductor body, a first control electrode for said field effect transistor tetrode, source and drain electrodes for said field effect transistor triode, a field effect transistor triode in said semiconductor body, and an electrode for said field effect transistor triode which extends between said source and said drain electrode for said field effect transistor tetrode to form a second control electrode for said field effect transistor tetrode.

BRIEF DESCRIPTION OF THE DRAWINGS

The invention will now be described in greater detail by way of example, with reference to the drawings, in which.

DESCRIPTION OF THE PREFERRED EMBODIMENTS

Figure 1:
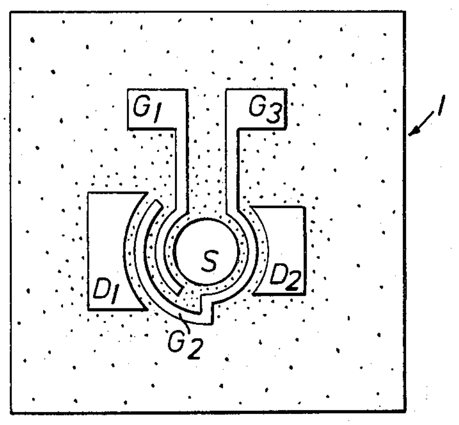
FIG. 1 is a plan view of a first form of the semiconductor arrangement in accordance with the invention.

Basically, the invention proposes that both components are accomodated in a common semiconductor body and in that an electrode of the field effect transistor extends between the source and drain electrode of the tetrode and there forms one of the two control electrodes.

Such a semiconductor arrangement can be advantageously used in mixing stages and in amplifying circuits and is characterized by a simple construction saving on semiconductor surface. One electrode is used doubly for both components. In mixing stages the oscillator transistor and the mixer transistor can be realized with this arrangement. In the case of components of the semiconductor arrangement in accordance with the invention, the control electrodes can be separated by insulating layers, particularly by oxide layers, from the semiconductor surface. However, on the other hand, the control electrodes can also be arranged directly on the semiconductor upper surface between the drain and source electrodes, when these electrodes have rectifying metal to semiconductor contacts (Schottky contacts).

In a particularly advantageous form of embodiment of the combined components, a source electrode is common to the individual transistor and to the tetrode. In this case the source electrode is arranged between the two drain electrodes of the two components.

The semiconductor arrangement in accordance with the invention can be built up with field effect transistors of the enrichment type, which are self-blocking, and with transistors of the impoverishment type, which are self-conducting. In the case of the self-blocking transistors of the impoverishment type, this conducting channel already exists with a zero control voltage. Charge carriers are dislodged out of the channel region by the electrical field with increasing control voltage of corresponding polarity and thus the channel is more and more tied up. In order to avoid temporal currents encircling the control electrode in the case of the self-conducting field effect transistors, the transistor structure is surrounded with an insulating region which is so laid out that, in practice, current only flows under the control electrode between the source and the drain electrode.

Referring now to the drawings, the structures of FIGS. 1, 2, 5 and 6 can be realized both in the case of MOS transistors and in the case of transistors with Schottky-contact-control electrodes.

FIG. 1 shows a structure in which the control electrode $G_3$ of the transistor simultaneously also forms the control electrode $G_2$ of the tetrode. Two drain electrodes $D_1$ and $D_2$ are arranged spaced apart, and between them is located the source electrode S which is common to both components. The electrode $G_3$, for example, runs in the form of a strip conductor betwen the electrode $D_2$ and the electrode S and thus extends still as a continuation $G_2$ between the drain electrode $D_1$ and the further control electrode $G_1$, which again is located between the electrode $G_2$ and the source electrode S. Both control electrodes $G_1$ and $G_2$ have the shape of strip conductors which run parallel to each other and which can be adapted, for example, to the circuit shape of the source electrode S. The contiguous electrodes $G_2$ and $G_3$ have, for example, the shape of an open circuit ring in the case of a circular source electrode.

In the arrangement illustrated in FIG. 1, the electrodes $D_1$, $G_2$, $G_1$, S are the electrodes of the tetrode while the electrodes S, $G_3$, $D_2$ are associated with the individual transistor.

Figure 2:
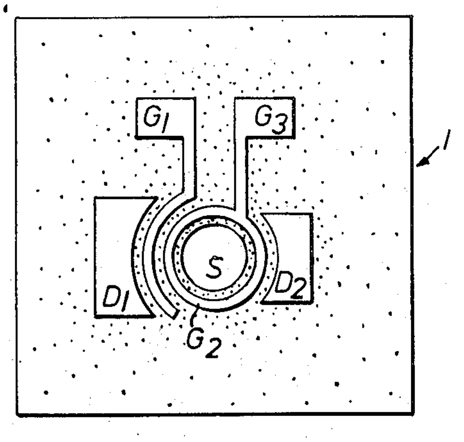
FIG. 2 is a view similar to that of FIG. 1 but showing a second form of semiconductor arrangement in accordance with the invention.

FIG. 2 shows another structure in which the control electrodes of the tetrode have been changed with each other with regard to position. The control electrode $G_2$, in the vicinity of the source electrode, of the tetrode is control electrode $G_3$ of the individual transistor at the same time. Therefore, the source electrode S, which is common to both components, can be surrounded with an annular strip which, between the electrodes $D_2$, and S, is the control electrode $G_3$ of the individual components and, between the electrodes S and $G_1$, is the control electode of the tetrode. Instead of an annular structure the two components can also be constructed as common elements also in a frame-like manner. The structure of the electrodes can be adapted to each other advantageously in each case.

Figure 3:
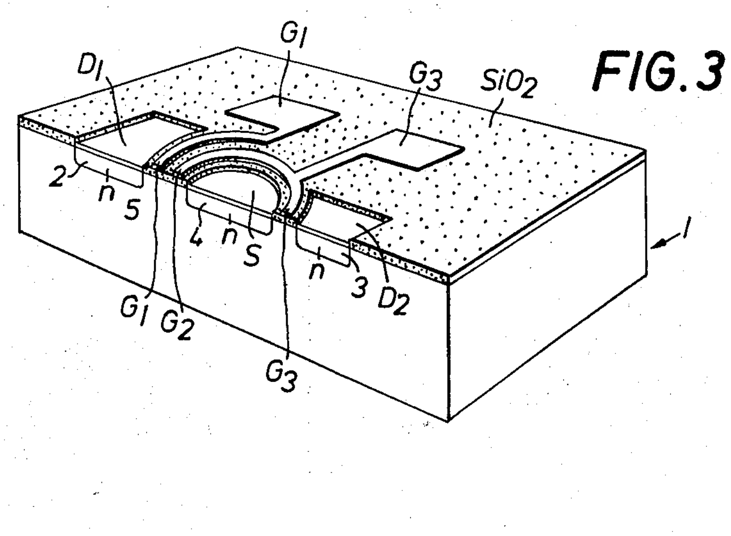
FIG. 3 is a part sectional part perspective view of the form show in plan view in FIG. 2.

In the case of the arrangement according to FIG. 3, a combination component with a structure of FIG. 2 is shown in section. Starting from a semiconductor body 1 of the first conductive type, a drain region 2, a source region 4 and a drain region 3 of the second conductive type are arranged next to each other on the upper surface. These regions are separated from each other on the semiconductor upper surface by oppositely doped regions of the basic semiconductor body. Conducting and controllable resistor channels are produced by inversion of these upper regions located between the regions 2 and 4 or 3 and 4 respectively, under the influence of an electrical field, which is caused by the control voltages at the control electrodes. These upper surface regions, are, in the case of MOS structures, covered with an oxide layer 5 on which the control electrodes are arranged. The drain region 2 of the tetrode is provided with the drain electrode $D_1$, the drain region 3 of the individual transistor is provided with the drain electrode $D_2$ and the source region 4 of both components is provided with the source electrode S. The control electrodes $G_1$ and $G_2$ extend on the oxide layer between the electrodes D1 and S wherein the electrode $G_2$ also extends between the source electrode S and the drain electrode $D_2$ as control electrode $G_3$.

Figure 4:
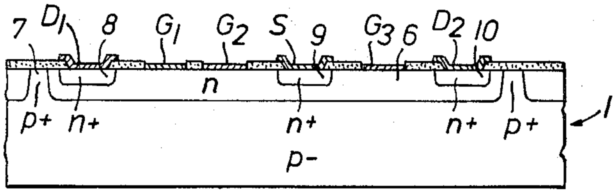
FIG. 4 is a sectional view of a semiconductor arrangement according to the invention using rectifying metal to semiconductor contacts.

FIG. 4 shows a corresponding semiconductor arrangement with Schottky-contact-electrodes. A region 6 of the second type of conductivity is accomodated in a weakly doped basic semiconductor body 1 of the first type of conductivity. The drain region 8, the source regions 9 and the drain region 10 of the second conductive type are let into this region 6 in a spaced manner. The semiconductor surface between the regions 8 and 9 and 10 respectively are laid bare and covered with the rectifying metal semiconductor contacts $G_1$, $G_2$, and $G_3$. Since the semiconductor arrangement shown is built up with self-conductive transistors, the active region of the combination component must be surrounded with a separation region 7 of the first conductivity type which prevents uncontrolled edge currents between the source and the drain electrodes.

Figure 5:
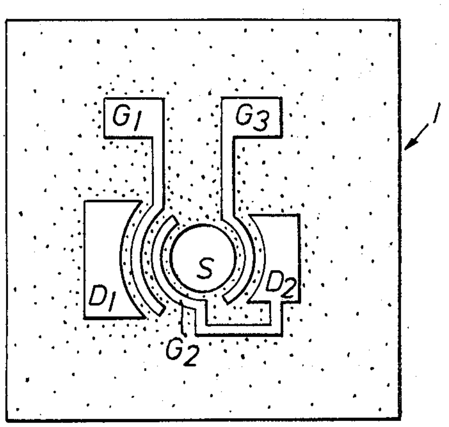
FIG. 5 is a plan view similar to FIG. 1 but showing a further form of semiconductor arrangement according to the invention.

FIG. 5 shows an electrode structure in which the drain electrode $D_2$ of the individual transistor simultaneously extends as control electrode $G_2$ between the drain electrode $D_1$ of the tetrode and the source electrode S. The control electrode $G_2$ is directly adjacent on one side of the source electrode S and on the other side adjacent to the second tetrode control electrode $G_1$ which in turn borders the drain electrode $D_1$. The control electordes in the exemplary embodiment have the shape of bent, metal strips adapted to the circular-shaped source electrode S.

Figure 6:
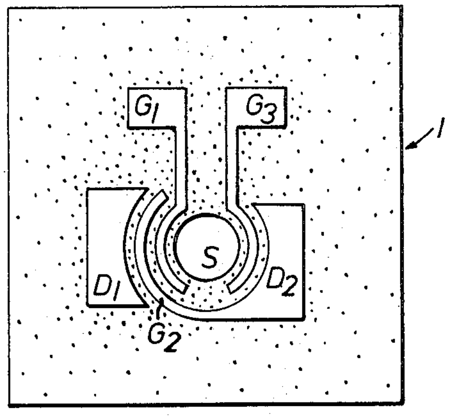
FIG. 6 is a plan view similar to FIG. 1 but showing a still further form of semiconductor arrangement according to the invention.

In the case of the structure of FIG. 6, the local position of the control electrodes $G_1$ and $G_2$ in the case of the arrangement according to FIG. 5 have been changed.

Figure 7:
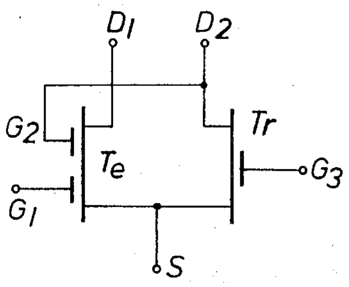
FIG. 7 is a circuit diagram of a semiconductor arrangement according to the invention in a mixer stage.

The equivalent circuit of the semiconductor arrangements with structures according to FIGS. 5 and 6 can be inferred from FIG. 7. The tetrode $T_e$ has the control electrodes $G_1$ and $G_2$, $G_2$ being connected with the drain electrode $D_2$ of the individual transistor Tr. The source electrode S is common to both components.

Figure 8:
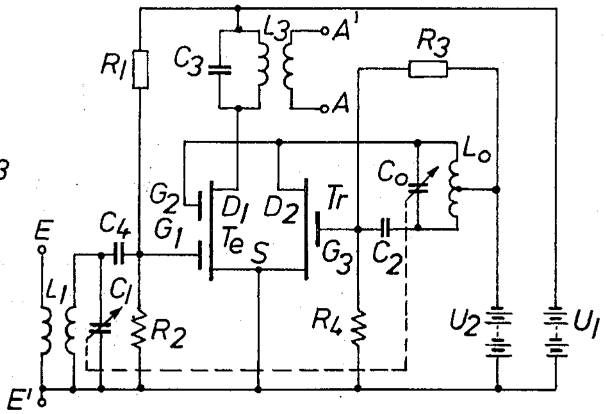

FIG. 8 shows a mixing stage in which a semiconductor arrangement finds application with the equivalent circuit diagram of FIG. 7. The high frequency is applied at the terminals EE and arrives via the parallel oscillating circuit $L_1$, $C_1$ at the control electrode $G_1$ of the tetrode. The resistances $R_1$ and $R_2$ form a voltage divider connected to the control electrode $G_1$ and determine its operating point. The operating point of the control electrode $G_3$ of the transistor TR is adjusted in the same way by the voltage divider made up of the resistances $R_3$, $R_4$. The coil $L_0$ determines the oscillator frequency $z$ in conjunction with the parallel-connected capacitance $C_0$. The parallel oscillating circuit made up of $L_0$, $C_0$ is therefore directly connected with the drain electrodes $D_2$ of the transistor Tr, which in turn is connected to the control electrode $G_2$ of the tetrode Te. The output $D_1$ of the tetrode is connected with the parallel oscillating circuit $C_3L_3$, from which the intermediate frequency is inductively derived. The capacitances $C_2$, $C_4$ serve for direct current decoupling; the necessary operational voltages are taken from the two batteries with voltages $U_1$ and $U_2$.

Figure 9:
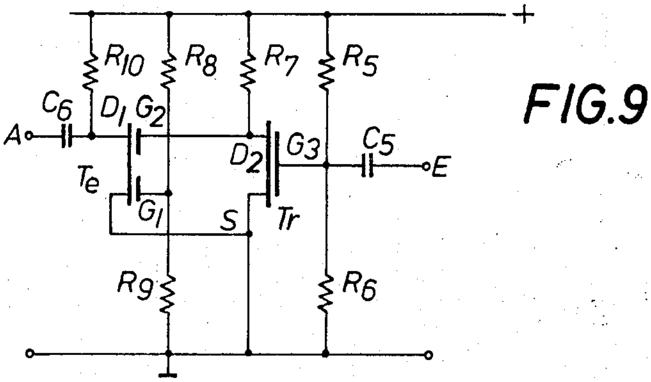
FIG. 9 is a circuit diagram showing the use of a semiconductor arrangement according to the invention as a two stage amplifier.

A semiconductor arrangement with the replacement circuit diagram according to FIG. 7 can also be used for a controlled amplifying stage according to FIG. 9. The resistances $R_8$, $R_9$, $R_5$, $R_6$, serve to adjust the operating points of the control electrodes $G_3$ (Tr) and $G_1$ (Te). The resistance $R_7$ connected between the voltage source and the drain electrode of the transistor Tr is the load resistance of the partial structure, now behaving as first amplifier stage, with the individual transistor Tr. The drain electrode $D_2$ and thus the output of the first amplifier stage is directly connected with the control electrode $G_2$ of the tetrode. Thus the twice amplified output signal will appear at the operational resistance $R_{10}$ connected to the drain electrode $D_1$ of the tetrode and taken off via the connecting contact A. The two capacitances $C_5$ and $C_6$ also here serve for the direct current decoupling of the amplifier circuit.

The semiconductor arrangement shown in FIGS. 1 and 2 can also be used in a mixing stage. In such a structure only the oscillator signal applied at $G_3$ is used in the tetrode part to change the amplification and not the alternating voltage of the drain electrode $D_2$.

It will be understood that the above description of the present invention is susceptible to various modification changes and adaptions.

What is claimed is:

1. In a semiconductor arrangement for a stage, particularly the mixer stage, of an amplifier, said arrangement including a field effect transistor tetrode having a source and a drain electrode and first and second control electrodes extending between said source and drain electrodes, and a field effect transistor triode having source and drain electrodes and a control electrode extending therebetween; the improvement wherein: said field effect transistor tetrode and said field effect transistor triode are formed in a single semiconductor body; and one of said electrodes of said field effect transistor triode extends between said source and drain electrodes of said field effect transistor tetrode and forms said second control electrode.

2. A semiconductor arrangement as defined in claim 1 wherein said source electrode of said field effect transistor triode and said source electrode of said field effect transistor tetrode form a common source electrode which is arranged between said drain electrode of said field effect transistor tetrode and said drain electrode of said field effect transistor triode.

3. A semiconductor arrangement as defined in claim 2, wherein said electrode of said field effect transistor triode which extends between said drain electrode of said field effect transistor tetrode and said common source electrode and forms said second control electrode of said field effect transistor tetrode is said control electrode of said field effect transistor triode.

4. A semiconductor arrangement as defined in claim 3, wherein said commonly connected control electrodes comprise an annular or frame-like electrode extending about said common source electrode and arranged in the region of said field effect transistor tetrode between said source electrode and said first control electrode.

5. A semiconductor arrangement as defined in claim 3 wherein said second control electrode of said field effect transistor tetrode extends between said drain electrode of said field effect transistor tetrode and first control electrode which is positioned adjacent said source electrode.

6. A semiconductor arrangement as defined in claim 2 wherein said electrode of said field effect transistor triode which extends between said drain electrode of said field effect transistor tetrode and said common source electrode and forms said second control electrode of said field effect transistor tetrode is the drain electrode of said field effect transistor triode.

7. A semiconductor arrangement as defined in claim 2 further comprising an insulating layer for separating said first and second control electrodes of said field effect transistor tetrode and said control electrode for said field effect transistor triode from an upper surface of said semiconductor body.

8. A semiconductor arrangement as defined in claim 2 wherein said first and second control electrodes of said field effect transistor tetrode and said control electrode for said field effect transistor triode comprise rectifying metal semiconductor contacts arranged directly on the upper surface of said semiconductor body.

9. A semiconductor arrangement as defined in claim 2 further comprising controllable channels between said drain electrode of said field effect transistor tetrode, said drain electrode for said field effect transistor triode and said common source electrode arising by enrichment of charge carriers.

10. A semiconductor arrangement as defined in claim 2, and comprising controllable channels between said drain electrode of said field effect transistor tetrode, said drain electrode for said field effect transistor triode and said common source electrode in which control of the channel cross sections of said controllable channels is carried out by impoverishment of charge carries.

* * * * *